United States Patent
Yan et al.

(10) Patent No.: US 8,952,440 B2
(45) Date of Patent: Feb. 10, 2015

(54) MEMORY DEVICE AND METHOD OF FORMING THE SAME

(71) Applicant: MACRONIX International Co., Ltd., Hsinchu (TW)

(72) Inventors: Shih-Guei Yan, Hsinchu (TW); Wen-Jer Tsai, Hsinchu (TW); Ping-Hung Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/774,449

(22) Filed: Feb. 22, 2013

(65) Prior Publication Data

US 2014/0239370 A1    Aug. 28, 2014

(51) Int. Cl.
*H01L 29/788* (2006.01)
*H01L 21/28* (2006.01)

(52) U.S. Cl.
USPC .................................. 257/316; 438/574

(58) Field of Classification Search
USPC ............. 438/182, 574, 585; 257/266, 316, 257/E21.624, E21.638
See application file for complete search history.

(56) References Cited

U.S. PATENT DOCUMENTS

| | | | |
|---|---|---|---|
| 6,448,163 B1 * | 9/2002 | Holbrook et al. | 438/585 |
| 2002/0064920 A1 | 5/2002 | Trivedi | |
| 2006/0019436 A1 * | 1/2006 | Lee | 438/197 |
| 2008/0089127 A1 * | 4/2008 | Mokhlesi et al. | 365/185.17 |
| 2008/0265342 A1 * | 10/2008 | Chang et al. | 257/411 |

FOREIGN PATENT DOCUMENTS

TW    200929364    7/2009

OTHER PUBLICATIONS

"Office Action of Taiwan Counterpart Application", issued on Nov. 12, 2014, pp. 1-6.

* cited by examiner

*Primary Examiner* — Calvin Lee
(74) *Attorney, Agent, or Firm* — J.C. Patents

(57) ABSTRACT

Provided is a memory device including a first dielectric layer, a T-shaped gate, two charge storage layers and two second dielectric layers. The first dielectric layer is disposed on a substrate. The T-shaped gate is disposed on the first dielectric layer and has an upper gate and a lower gate, wherein two gaps are present respectively at both sides of the lower gate and between the upper gate and the substrate. The charge storage layers are respectively embedded into the gaps. A second dielectric layer is disposed between each charge storage layer and the upper gate, between each charge storage layer and the lower gate and between each charge storage layer and the substrate.

6 Claims, 5 Drawing Sheets

MEMORY DEVICE AND METHOD OF FORMING THE SAME

BACKGROUND OF THE INVENTION

1. Field of Invention

The present invention relates to a semiconductor device and a method of forming the same, and more generally to a memory device and a method of forming the same.

2. Description of Related Art

Among various types of memory products, a non-volatile memory allows multi-time data programming, reading and erasing operations, and the data stored therein can be retained even after the power to the memory is terminated. With these advantages, the non-volatile memory has become one of the most widely adopted memories for personal computers and electronic equipment. Electrically programmable and erasable non-volatile memory technologies based on charge storage structures and known as Electrically Erasable Programmable Read-Only Memory (EEPROM) and flash memory are used in various modern applications.

A flash memory is designed with an array of memory cells that can be independently programmed and read. Traditional flash memory cells store charges in floating gates, but another type of flash memory uses a charge-trapping structure, such as a layer of non-conductive SiN material, instead of a floating gate including a conductive material. When a charge-trapping cell is programmed, charges are trapped and do not move through the non-conductive layer. The charges are retained by the charge trapping layer until the cell is erased, retaining the data state without continuously applied electrical power. Charge-trapping cells can be operated as two-sided cells. That is, because the charges do not move through the non-conductive charge trapping layer, the charges can be localized at different charge-trapping sites. On the other words, in the flash memory devices with the use of the charge-trapping structures, more than one bit of information is stored in each memory cell. Usually, one of four distinct combinations of bits 00, 01, 10 and 11 can be stored in a memory cell having a charge-trapping structure, wherein each combination has a corresponding threshold voltage (Vt). In a read operation, the current flowing through the memory cell varies depending upon the Vt of the cell. Typically, such current has one of four different values each corresponding to a different Vt. Accordingly, by sensing such current, the particular bit combination stored in the cell is determined.

The total available charge range or Vt range can be referred to as the memory operation window. In other words, the memory operation window is defined by the difference between the program level and the erase level. A large memory operation window is desired as good level separation between states is needed for cell operation. The performance of two-bit memory cells, however, is often degraded by the so-called "second bit effect" in which localized charges in the charge-trapping structure interact with each other. For example, during a reverse read operation, a read bias is applied to the drain terminal and the charge stored near the source region (i.e., a "first bit") is sensed, then the bit near the drain region (i.e., the "second bit"), however, creates a potential barrier for reading the first bit near the source region. This barrier can be overcome by applying a bias with a suitable magnitude, using the drain-induced barrier lowering (DIBL) effect to suppress the effect of the second bit near the drain region and allow the sensing of the storage status of the first bit. However, when the second bit near the drain region is programmed to a high Vt state and the first bit near the source region is at un-programmed state, the second bit raises this barrier substantially. Thus, as the Vt associated with the second bit increases, the read bias for the first bit becomes insufficient to overcome the potential barrier created thereby. Therefore, the Vt associated with the first bit is raised as a result of the higher Vt of the second bit, which reduces the memory operation window. The second bit effect decreases the memory operation window for two-bit/cell operation, so there is a need for methods and devices capable of suppressing the second bit effect in memory devices.

SUMMARY OF THE INVENTION

Accordingly, the present invention provides a memory device and a method of forming the same, in which well confined charge storage regions are provide, so that the stored charges are fully localized to reduce the $2^{nd}$-bit effect and minimize the program disturbance phenomenon.

The present invention provides a memory device including a first dielectric layer, a T-shaped gate, two charge storage layers and two second dielectric layers. The first dielectric layer is disposed on a substrate. The T-shaped gate is disposed on the first dielectric layer and has an upper gate and a lower gate, wherein two gaps are present respectively at both sides of the lower gate and between the upper gate and the substrate. The charge storage layers are respectively embedded into the gaps. A second dielectric layer is disposed between each charge storage layer and the upper gate, between each charge storage layer and the lower gate and between each charge storage layer and the substrate.

According to an embodiment of the present invention, the thickness of the first dielectric layer is less than or equal to the thickness of each second dielectric layer.

According to an embodiment of the present invention, the ratio of the thickness of the lower gate to the thickness of the upper gate ranges from about 2 to 1/25.

According to an embodiment of the present invention, the memory device further includes two doped regions disposed in the substrate at two sides of the T-shaped gate and a word line disposed on and electrically connected to the T-shaped gate.

According to an embodiment of the present invention, each charge storage layer includes silicon nitride or doped polysilicon.

According to an embodiment of the present invention, the boundary of each charge storage layer is extended outwardly beyond the boundary of the upper gate.

The present invention further provides a method of forming a memory device. A plurality of stacked structures is formed on a substrate. Each stacked structure includes, from bottom to top, a first dielectric layer, a lower gate, and a sacrificial pattern, wherein two gaps are present respectively at two sides of each lower gate and between the corresponding sacrificial pattern and the substrate. Two charge storage layers and two second dielectric layers are formed in the two gaps below each sacrificial pattern. Under each sacrificial pattern, a second dielectric layer is disposed between each charge storage layer and the sacrificial pattern, between each charge storage layer and the lower gate and between each charge storage layer and the substrate. A third dielectric layer is formed to fill up a plurality of gaps between the stacked structures. The sacrificial patterns are removed to form a plurality of openings in the third dielectric layer. A plurality of upper gates is respectively formed in the openings, wherein each upper gate and the corresponding lower gate constitute a T-shaped gate.

According to an embodiment of the present invention, the method of forming the stacked structures includes the following steps. A first dielectric material layer, a lower gate material layer and a sacrificial layer are sequentially formed on the substrate. A patterned mask layer is formed on the sacrificial layer. A portion of the sacrificial layer and a portion of the lower gate material layer are removed by using the patterned mask layer as a mask, so as to form the lower gates and the sacrificial patterns located on the lower gates. The width of the lower gates is trimmed, so as to form two undercuts below each sacrificial pattern. The first dielectric material layer not covered by the trimmed lower gates is removed, so as to respectively form the first dielectric layers below the lower gates.

According to an embodiment of the present invention, the patterned mask layer includes photoresist, advanced patterning film or a combination thereof.

According to an embodiment of the present invention, the method of forming the first dielectric material layer includes performing a furnace process, a chemical vapour deposition process or an atomic layer deposition process.

According to an embodiment of the present invention, the method of trimming the width of the lower gates includes performing a wet etching process.

According to an embodiment of the present invention, the method of removing the first dielectric material layer not covered by the trimmed lower gates includes performing a wet etching process.

According to an embodiment of the present invention, the sacrificial layer includes silicon nitride.

According to an embodiment of the present invention, the method of forming the charge storage layers and the second dielectric layers includes the following steps. A second dielectric material layer is formed on the substrate, and the second dielectric material layer covers the stacked structures and the substrate between the stacked structures. A charge storage material layer is formed to cover the second dielectric material layer and fill up the gaps. A portion of the charge storage material layer and a portion of the second dielectric material layer are removed.

According to an embodiment of the present invention, the method of forming the second dielectric material layer includes performing a chemical vapour deposition process or an atomic layer deposition process.

According to an embodiment of the present invention, the method of forming the charge storage material layer includes performing a furnace process, a chemical vapour deposition process or an atomic layer deposition process.

According to an embodiment of the present invention, the method of removing the portion of the charge storage material layer and the portion of the second dielectric material layer includes performing a dry etching process.

According to an embodiment of the present invention, the method further includes, after the step of forming the charge storage layers and the second dielectric layers and before the step of forming the third dielectric layer, forming a plurality of doped regions in the substrate at two sides of the stacked structures. The method further includes, after the step of forming the upper gates, forming a word line disposed on and electrically connected to the T-shaped gates.

According to an embodiment of the present invention, the thickness of each first dielectric layer is less than or equal to the thickness of each second dielectric layer.

According to an embodiment of the present invention, the ratio of the thickness of each lower gate to the thickness of each upper gate ranges from about 2 to 1/25.

In view of the above, since two charge storage layers are separated by the lower gate of a T-shaped gate, the memory device of the present invention has two well confined charge storage regions, and thus, the stored charges are fully localized to reduce the $2^{nd}$-bit effect and minimize the program disturbance phenomenon.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1H-1 schematically illustrates a cross-sectional view of a memory device according to another embodiment of the present invention.

DESCRIPTION OF EMBODIMENTS

Figure 1A:
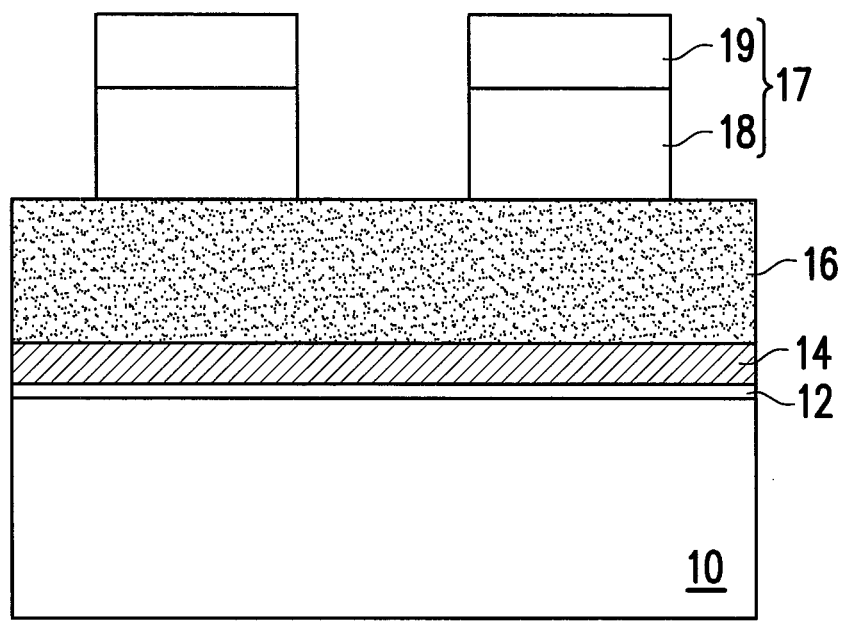
FIG. 1A to FIG. 1H schematically illustrate cross-sectional views of a method of forming a memory device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1H schematically illustrate cross-sectional views of a method of forming a memory device according to an embodiment of the present invention.

Referring to FIG. 1A, a first dielectric material layer 12, a lower gate material layer 14 and a sacrificial layer 16 are sequentially formed on a substrate 10. The substrate 10 can include a semiconductor material, such as bulk silicon or silicon on insulator (SOI), or a semiconductor compound. The first dielectric material layer 12 can include silicon oxide or a suitable material, and the forming method thereof can include performing a furnace oxidation process, a chemical vapour deposition (CVD) process, an atomic layer deposition (ALD) process or a suitable process. The lower gate material layer 14 can include doped polysilicon, and can be formed by depositing undoped polysilicon through CVD and ion-implanting the same, or by polysilicon CVD with in-situ doping. The sacrificial layer 16 can include silicon nitride, and the forming method thereof can include performing a CVD process, an ALD process or a suitable process. Besides, the first dielectric material layer 12 has a thickness of about 30 angstroms to 80 angstroms, the lower gate material layer 14 has a thickness of about 80 angstroms to 100 angstroms, and the sacrificial layer 16 has a thickness of about 100 angstroms to 2,000 angstroms.

Thereafter, a patterned mask layer 17 is formed on the sacrificial layer 16. The patterned mask layer 17 can include photoresist, Advanced Patterning Film™ (APF) available from Applied Material, Inc. of Santa Clara, Calif., or a combination thereof. In an embodiment, the patterned mask layer 17 is a stacked structure including a lower APF 18 and an upper photoresist layer 19, as shown in FIG. 1A. The patterns of the photoresist layer 19 can be formed through exposure and development, and the patterns of the APF 18 can be transferred from the photoresist layer 19 through an etching process. In another embodiment (not shown), the patterned mask layer 17 can be a single layer.

Figure 1B:
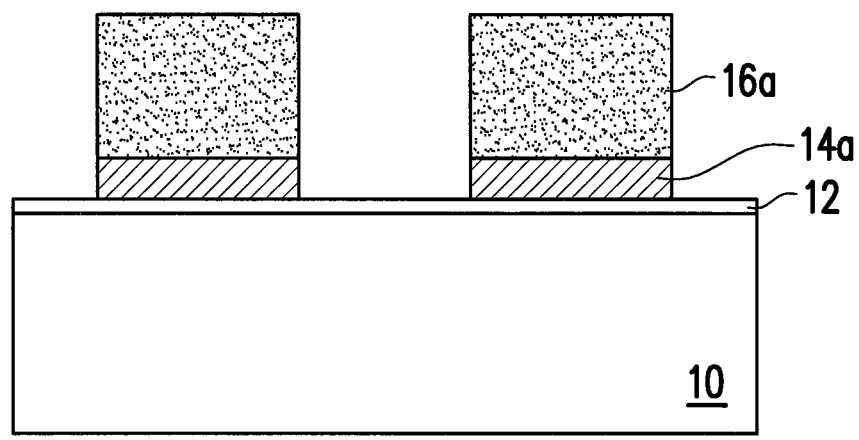

Referring to FIG. 1B, a portion of the sacrificial layer 16 and a portion of the lower gate material layer 14 are removed by using the patterned mask layer 17 as a mask, so as to form at least two lower gates 14a and sacrificial patterns 16a located on the lower gates 14a. The method of removing the portion of the sacrificial layer 16 and the portion of the lower gate material layer 14 can include performing a dry etching process or a suitable process. Afterwards, the patterned mask layer 17 is removed through a dry etching process or a suitable process.

Figure 1C:
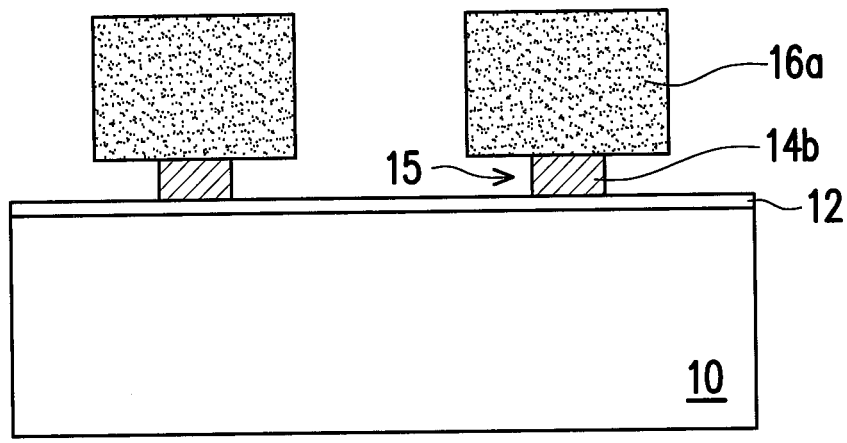

Referring to FIG. 1C, the width of the lower gates 14a is trimmed, so as to form two undercuts 15 below each sacrificial pattern 16a. Specifically, each trimmed lower gate 14b exposes a portion of the bottom of the corresponding sacrificial pattern 16a. The method of trimming the width of the lower gates 14a can include performing a wet etching process or a suitable process.

Figure 1D:
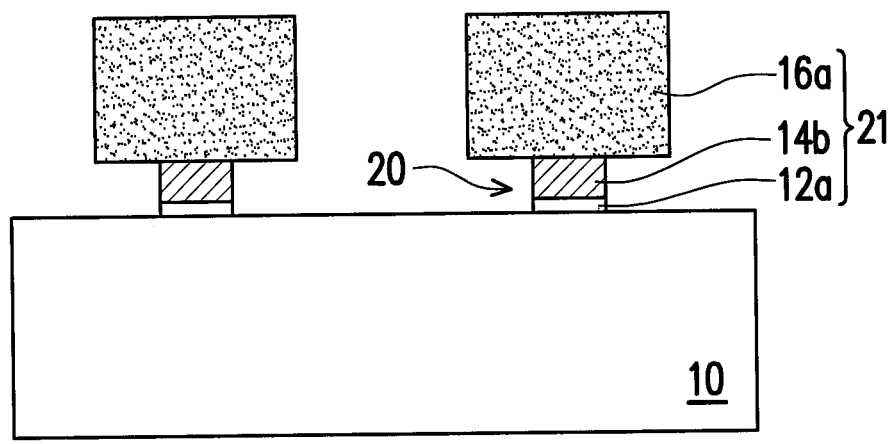

Referring to FIG. 1D, the first dielectric material layer 102 not covered by the trimmed lower gates 14b is removed, so as to form a plurality of first dielectric layers 12a respectively below the lower gates 14b. The method of removing the first dielectric material layer 102 not covered by the trimmed lower gates 14b can include performing a wet etching process or a suitable process. Herein, two gaps 20 are present respectively at two sides of each lower gate 14b and between the corresponding sacrificial pattern 16a and the substrate 10. The gaps 20 serve as local storage spaces. Each first dielectric layer 12a, the corresponding lower gate 14b and the corresponding sacrificial pattern 16a constitute a stacked structure 21.

In view of the foregoing, a plurality of stacked structures 21 each including, from bottom to top, a first dielectric layer 12a, a lower gate 14b, and a sacrificial pattern 16a is formed on the substrate 10. Besides, two gaps 20 are present respectively at two sides of each lower gate 14b and between the corresponding sacrificial pattern 16a and the substrate 10. The stacked structures 21 can be formed with reference to steps of FIG. 1A to FIG. 1D or other suitable steps.

Figure 1E:
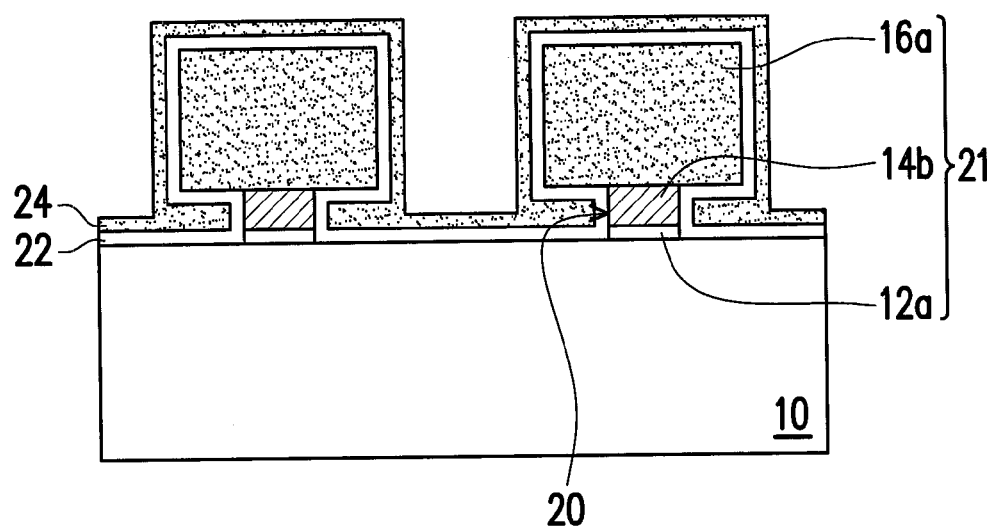

Referring to FIG. 1E, a second dielectric material layer 22 is formed on the substrate 10, and the second dielectric material layer 22 covers the stacked structures 21 and the substrate 10 between the stacked structures 21. Specifically, the second dielectric material layer 22 conformally and completely covers the upper surface, sidewall and bottom surface of each stacked structure 21 and the surface of the substrate 10. The second dielectric material layer 22 fills in the gaps 20 (FIG. 1D) but does not fill up the gaps 20. The second dielectric material layer 22 has a thickness greater than or equal to that of the first dielectric layer 12a. The second dielectric material layer 22 has a thickness of about 30 angstroms to 80 angstroms. The second dielectric material layer 22 can include silicon oxide, and the forming method thereof can include performing ISSG (in-situ steam generation) oxidation, CVD or ALD. It is noted that the second dielectric material layer 22 can be formed through a deposition process so as to prevent the lower gates 14b from being oxidized. Alternatively, any suitable process can be adopted to form the second dielectric material layer 22, as long as the adopted process does not completely oxidize the lower gates 14b.

Thereafter, a charge storage material layer 24 is formed to cover the second dielectric material layer 22 and fill up the gaps 20. The charge storage material layer 24 can include silicon nitride or doped polysilicon. Silicon nitride can be formed by furnace nitridation, CVD or ALD. Doped polysilicon can be formed by polysilicon CVD with in-situ doping.

Figure 1F:
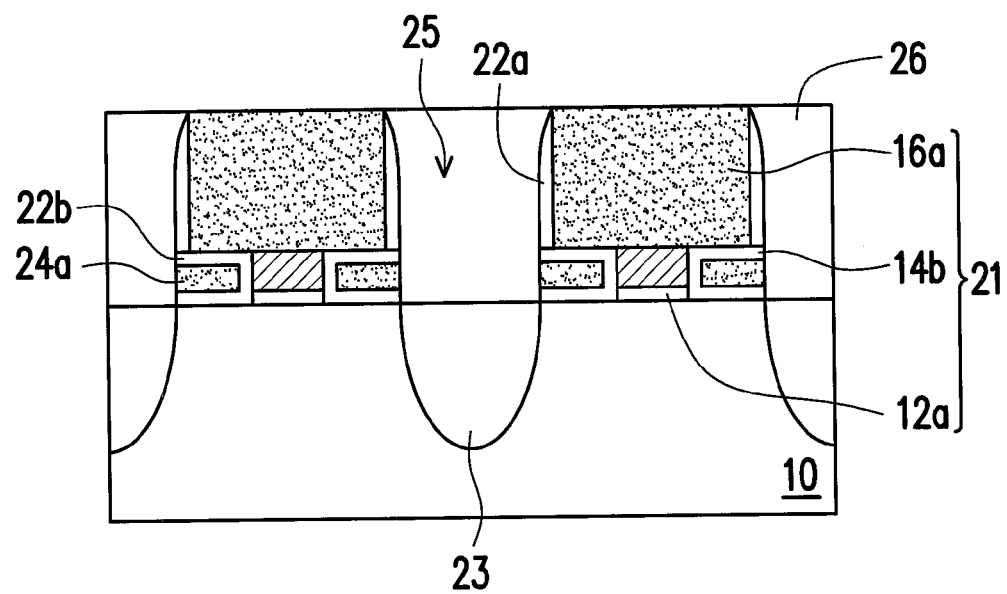

Referring to FIG. 1F, a portion of the charge storage material layer 24 and a portion of the second dielectric material layer 22 are removed, so as to form two charge storage layers 24a and two second dielectric layers 22b in the two gaps 20 below each sacrificial pattern 16a. Under each sacrificial pattern 16a, a second dielectric layer 22b is disposed between each charge storage layer 24a and the sacrificial pattern 16a, between each charge storage layer 24a and the lower gate 14b and between each charge storage layer 24a and the substrate 10. The method of removing the portion of the charge storage material layer 24 and the portion of the second dielectric material layer 22 can include performing an anisotropic etching process, such as a dry etching process. In addition, during the step of forming the charge storage layers 24a and the second dielectric layers 22b, a spacer 22a is simultaneously formed on the sidewall of each sacrificial pattern 16a.

Thereafter, a plurality of doped regions 23 is formed in the substrate 10 at two sides of the stacked structures 21, wherein the adjacent stacked structures 21 share one doped region 23. The method of forming the doped regions 23 can include performing an ion implantation process. The doped regions 23 have a conductivity type different from that of the substrate 10. In an embodiment, the substrate 10 is P-doped and the doped regions 23 are N-doped. In another embodiment, the substrate 10 is N-doped and the doped regions 23 are P-doped. The N-type dopant can include phosphorus or arsenic. The P-type dopant can include boron or boron difluoride. The doped regions serve as source regions or drain regions of a memory device.

Afterwards, a third dielectric layer 26 is formed to fill up a plurality of gaps 25 between the stacked structures 21. Specifically, the third dielectric layer 26 fills in the gap 25 between any two adjacent stacked structures 21, has a planar surface and exposes the top surfaces the sacrificial patterns 16a of the stacked structures 21. The third dielectric layer 26 can include silicon oxide, and can be formed by depositing a dielectric material layer through CVD and then planarizing the same. The planarization can utilize an etching-back process or a chemical mechanical polishing (CMP) process.

Figure 1G:
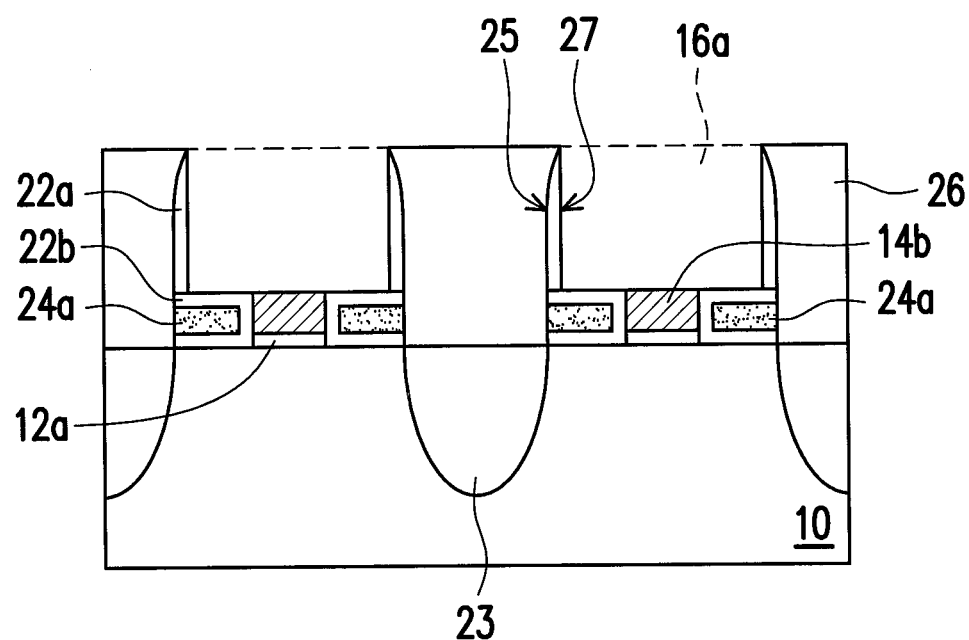

Referring to FIG. 1G, the sacrificial patterns 16a are removed to form a plurality of openings 27 in the third dielectric layer 26. Specifically, the openings 27 expose the surfaces of the second dielectric layers 22b and the surfaces of the lower gates 14b. The method of removing the sacrificial patterns 16a can include performing an isotropic etching process, such as a dry etching process, a wet etching process or a suitable process.

Figure 1H:
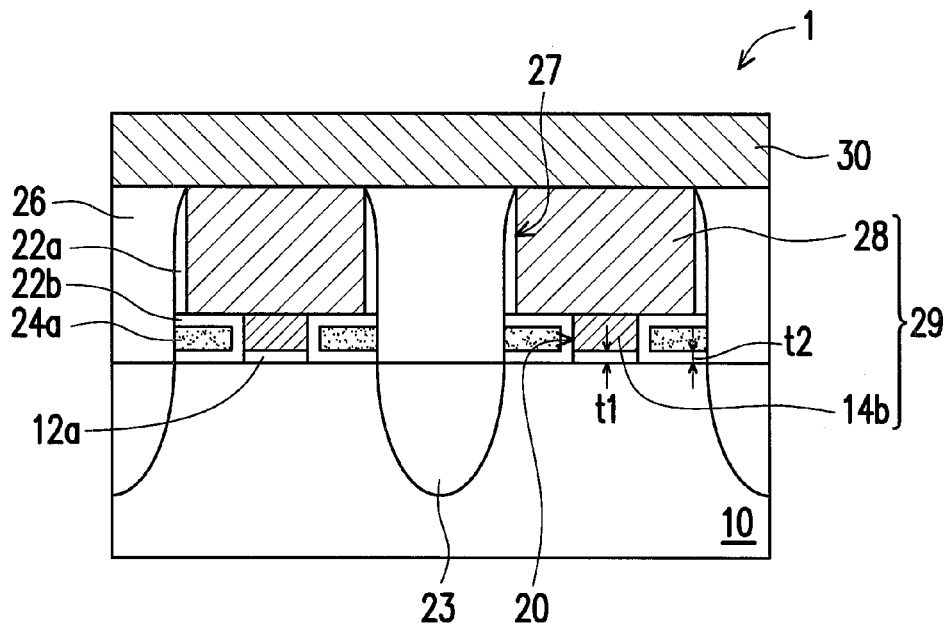

Referring to FIG. 1H, a plurality of upper gates 28 are respectively formed in the openings 27, wherein each upper gate 28 and the corresponding lower gate 14b constitute a T-shaped gate 29. The method of forming the upper gates 28 can include forming an upper gate material layer through CVD, and the upper gate material layer covers the third dielectric layer 26 and fills in the openings 27. The upper gate material layer can be formed by depositing undoped polysilicon through CVD and ion-implanting the same, or by polysilicon CVD with in-situ doping. Thereafter, the upper gate material layer outside of the openings 27 is removed through CMP.

Afterwards, a word line 30 is formed on and electrically connected to the T-shaped gates 29. In an embodiment, the extension direction of the word line 30 is different from that of the doped regions 23, and can be substantially perpendicular to the latter. The word line 30 can be formed by depositing a blanket word line material layer and then patterning the same. The word line material layer can include a conductive material, such as doped polysilicon, metal, metal alloy, or a combination thereof. Doped polysilicon can be formed by depositing undoped polysilicon through CVD and ion-implanting the same, or by polysilicon CVD with in-situ doping. The metal or metal alloy can be formed through sputtering or CVD, or a suitable process. The memory device 1 of the present invention is thus completed.

The memory device of the present invention is illustrated below with reference to FIG. 1H. The memory device 1 of the present invention includes a plurality of memory cells (e.g. two memory cells are exemplified in FIG. 1H), and each memory cell can include a first dielectric layer 12a, a T-shaped gate 29, two charge storage layers 24a, two second dielectric layers 22b, two doped regions 23 and a word line 30. The first dielectric layer 12a is disposed on a substrate 10. The first dielectric layer 12a has a thickness of about 30 angstroms to 80 angstroms. The T-shaped gate 29 is disposed on the first dielectric layer 12a and has an upper gate 28 and a lower gate 14b. The lower gate 14b has a thickness of about 80 angstroms to 200 angstroms, and the upper gate 28 has a thickness of 100 angstroms to 2,000 angstroms. Besides, the ratio of the thickness of the lower gate 14b to the thickness of the upper gate 28 ranges from about 2 to 1/25. Herein, two gaps 20 are present respectively at two sides of the lower gate 14b and between the upper gate 28 and the substrate 10. In an embodiment, the sidewall of the lower gate 14b is aligned with the sidewall of the first dielectric layer 12a. The doped regions 23 are disposed in the substrate 10 at two sides of the T-shaped gate 29. The word line 30 is disposed on and electrically connected to the T-shaped gate 29.

Figures 1, 1H:
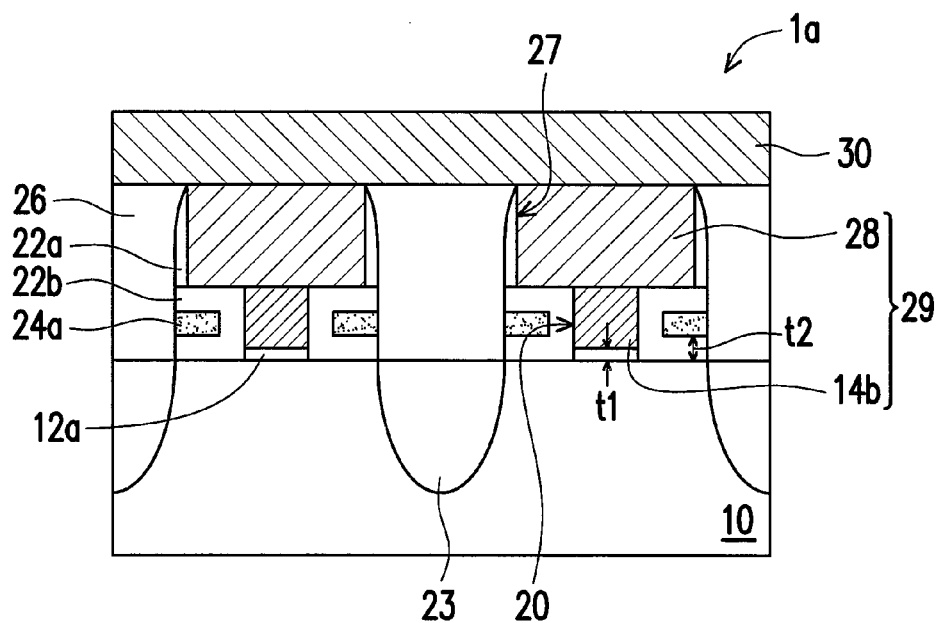

The charge storage layers 24 are respectively embedded into the gaps 20. The charge storage layers 24 can include silicon nitride or doped polysilicon. In an embodiment, the boundary of each charge storage layer 24 is extended outwardly beyond the boundary of the upper gate 28, as shown in FIG. 1H. In another embodiment (not shown), the boundary of each charge storage layer 24 can be aligned with the boundary of the upper gate 28. A second dielectric layer 22b is disposed between each charge storage layer 24a and the upper gate 28, between each charge storage layer 24a and the lower gate 14b and between each charge storage layer 24a and the substrate 10. Each second dielectric layer 22b has a thickness of about 30 angstroms to 80 angstroms. In addition, the thickness t1 of the first dielectric layer 12a is less than or equal to the thickness t2 of each second dielectric layer 22b. In the embodiment of FIG. 1H, the thickness t1 of the first dielectric layer 12a is equal to the thickness t2 of each second dielectric layer 22b, but the present invention is not limited thereto. In another embodiment, the thickness t1 of the first dielectric layer 12a is less than the thickness t2 of each second dielectric layer 22b, as shown in the memory device 1a of FIG. 1H-1.

In each memory cell of the memory device 1 and memory device 1a of the present invention, the first dielectric layer 12a serves as a gate dielectric layer. The second dielectric layer 22b located below the charge storage layer 24a serves as a tunneling dielectric layer, and the second dielectric layer 22b located between the charge storage layer 24a and the lower gate 14b and between the charge storage layer 24a and the upper gate 28 serves as a liner or an inter-gate dielectric layer. In this embodiment, the liner/inter-gate dielectric layer and the gate dielectric layer have the same thickness, but the present invention is not limited thereto. People having ordinary skill in the art should appreciate that the liner/inter-gate dielectric layer and the gate dielectric layer can be formed to have different thicknesses. The doped regions 23 serve as source/drain regions.

In summary, since two charge storage layers are separated by the lower gate of a T-shaped gate including conductive layer (for example, doped polysilicon), the memory device of the present invention has two well confined charge storage regions, and thus, the stored charges are fully localized to reduce the $2^{nd}$-bit effect and minimize the program disturbance phenomenon. Moreover, by designing a T-shaped gate and fabricating a tunnelling dielectric layer (i.e. the second dielectric layer located below the charge storage layer) thicker than or as thick as a gate dielectric layer (i.e. the first dielectric layer), two charge storage regions can be effectively separated so as to greatly reduce the $2^{nd}$-bit effect and according improve the performance of the device.

The present invention has been disclosed above in the preferred embodiments, but is not limited to those. It is known to persons skilled in the art that some modifications and innovations can be made without departing from the spirit and scope of the present invention. Therefore, the scope of the present invention should be defined by the following claims.

What is claimed is:

1. A memory device, comprising:
   a first dielectric layer, disposed on a substrate;
   a T-shaped gate, disposed on the first dielectric layer and having an upper gate and a lower gate, wherein two gaps are present respectively at two sides of the lower gate and between the upper gate and the substrate, and the upper gate and the lower gate are in direct contact with each other;
   two charge storage layers, respectively embedded into the gaps, wherein a bottom of each of the charge storage layers is not lower than a top of the first dielectric layer; and
   a second dielectric layer, disposed between each charge storage layer and the upper gate, between each charge storage layer and the lower gate and between each charge storage layer and the substrate.

2. The memory device of claim 1, wherein a thickness of the first dielectric layer is less than or equal to a thickness of each second dielectric layer.

3. The memory device of claim 1, wherein a ratio of a thickness of the lower gate to a thickness of the upper gate ranges from 2 to 1/25.

4. The memory device of claim 1, further comprising:
   two doped regions, disposed in the substrate at two sides of the T-shaped gate; and
   a word line, disposed on and electrically connected to the T-shaped gate.

5. The memory device of claim 1, wherein each charge storage layer comprises silicon nitride or doped polysilicon.

6. The memory device of claim 1, wherein a boundary of each charge storage layer is extended outwardly beyond a boundary of the upper gate.

* * * * *